(12) United States Patent
Nishikawa et al.

(10) Patent No.: US 7,935,892 B2
(45) Date of Patent: May 3, 2011

(54) ELECTRONIC CIRCUIT DEVICE AND METHOD FOR MANUFACTURING SAME

(75) Inventors: Kazuhiro Nishikawa, Osaka (JP);
Hidenori Miyakawa, Osaka (JP);
Norihito Tsukahara, Kyoto (JP);
Shigeaki Sakatani, Osaka (JP)

(73) Assignee: Panasonic Corporation, Osaka (JP)

(*) Notice: Subject to any disclaimer, the term of this patent is extended or adjusted under 35 U.S.C. 154(b) by 731 days.

(21) Appl. No.: 11/909,886

(22) PCT Filed: Apr. 14, 2006

(86) PCT No.: PCT/JP2006/307915
§ 371 (c)(1),
(2), (4) Date: Sep. 27, 2007

(87) PCT Pub. No.: WO2006/112383
PCT Pub. Date: Oct. 26, 2006

(65) Prior Publication Data
US 2009/0133900 A1    May 28, 2009

(30) Foreign Application Priority Data

Apr. 14, 2005 (JP) ................................. 2005-116833

(51) Int. Cl.
*H05K 1/16* (2006.01)
(52) U.S. Cl. ........ 174/260; 174/255; 174/259; 174/261; 361/760; 361/783; 257/725; 257/734; 257/737; 257/738; 428/143; 428/220; 428/327; 438/119; 438/125; 438/151; 438/162; 438/486; 438/612; 439/91
(58) Field of Classification Search .................. 174/260, 174/255, 259, 261; 361/760, 783; 257/725, 257/734, 737, 738; 428/143, 220, 327; 438/119, 125, 151, 162, 486, 612; 439/91
See application file for complete search history.

(56) References Cited

U.S. PATENT DOCUMENTS

| 617,287 A | 3/1899 | Garlock |
| 5,019,944 A * | 5/1991 | Ishii et al. ..................... 361/783 |
| 5,122,430 A * | 6/1992 | Nishitsuji et al. .......... 430/108.6 |

(Continued)

FOREIGN PATENT DOCUMENTS

JP           11-195860         7/1999

(Continued)

OTHER PUBLICATIONS

Partial English Translation of JP 2000-133330A (May 2000), which was cited in Information Disclosure Statement filed Sep. 27, 2007.

(Continued)

*Primary Examiner* — Xiaoliang Chen
(74) *Attorney, Agent, or Firm* — Wenderoth, Lind & Ponack, L.L.P.

(57) ABSTRACT

Circuit board having conductor wiring and connection terminal; anisotropic conductive resin layer provided on one surface of circuit board; and plurality of electronic components respectively provided with electrode terminals in positions facing the connection terminal are included. The anisotropic conductive resin layer includes at least one kind of conductive particles selected from coiled conductive particles, fiber fluff conductive particles and conductive particles provided with a plurality of conductive protrusions, and resin binder; electrically couples electrode terminals of plurality of electronic components to connection terminals to each other with conductive particles; mechanically fixes electronic components and circuit board to each other; and protects conductor wiring.

11 Claims, 8 Drawing Sheets

U.S. PATENT DOCUMENTS

| | | | | |
|---|---|---|---|---|
| 5,374,467 | A * | 12/1994 | Sato | 428/143 |
| 5,989,405 | A * | 11/1999 | Murata et al. | 205/110 |
| 5,994,165 | A * | 11/1999 | Yoshino et al. | 438/106 |
| 6,356,333 | B1 * | 3/2002 | Uchiyama | 349/149 |
| 6,506,980 | B2 * | 1/2003 | Hashimoto | 174/261 |
| 6,542,374 | B1 * | 4/2003 | Muramatsu et al. | 361/760 |
| 6,603,107 | B2 * | 8/2003 | Miyake | 250/208.1 |
| 6,803,296 | B2 * | 10/2004 | Miyairi | 438/486 |
| 6,831,717 | B2 * | 12/2004 | Hanakawa et al. | 349/113 |
| 6,909,178 | B2 * | 6/2005 | Sakamoto et al. | 257/725 |
| 6,916,433 | B2 * | 7/2005 | Mitani et al. | 252/500 |
| 6,927,818 | B2 * | 8/2005 | Hinata et al. | 349/114 |
| 6,955,948 | B2 * | 10/2005 | Asahi et al. | 438/125 |
| 7,004,376 | B2 * | 2/2006 | Ashida | 228/215 |
| 7,060,602 | B2 * | 6/2006 | Saito | 438/612 |
| 7,109,074 | B2 * | 9/2006 | Ichijo et al. | 438/162 |
| 7,161,371 | B2 * | 1/2007 | Higashitani et al. | 324/763 |
| 7,166,920 | B2 * | 1/2007 | Saito et al. | 257/738 |
| 7,341,642 | B2 * | 3/2008 | Kumakura | 156/273.5 |
| 7,384,828 | B2 * | 6/2008 | Asami et al. | 438/151 |
| 2003/0029559 | A1 * | 2/2003 | Yamada et al. | 156/307.7 |
| 2004/0130024 | A1 * | 7/2004 | Tsukahara et al. | 257/737 |
| 2005/0127504 | A1 * | 6/2005 | Imai | 257/734 |

FOREIGN PATENT DOCUMENTS

| | | |
|---|---|---|
| JP | 11-306861 | 11/1999 |
| JP | 2000-133330 | 5/2000 |
| JP | 2000-195339 | 7/2000 |
| JP | 2001-102410 | 4/2001 |
| JP | 2002/0014615 | 2/2002 |
| JP | 6344156 | 2/2002 |
| JP | 2003-204135 | 7/2003 |
| JP | 2004-238443 | 8/2004 |

OTHER PUBLICATIONS

Partial English Translaion of JP 2003-204135A (Jul. 2003), which was cited in Information Disclosure Statement filed Sep. 27, 2007.
International Search Report issued May 16, 2006 in the International (PCT) Application of which the present application is the U.S. National Stage.

* cited by examiner

ELECTRONIC CIRCUIT DEVICE AND METHOD FOR MANUFACTURING SAME

This application is a U.S. national phase application of PCT International Application PCT/JP2006/307915, filed Apr. 14, 2006.

TECHNICAL FIELD

The present invention relates to an electronic circuit device in which connection terminals on a circuit board and electrode terminals of electronic components are coupled to each other by using an anisotropic conductive resin including elastic conductive particles in a resin binder.

BACKGROUND ART

Conventionally, when a flexible circuit board is coupled to a liquid crystal display panel or when electronic components such as a semiconductor component, resistor, capacitor, or the like, are mounted on a circuit board, an anisotropic conductive adhesive or an anisotropic conductive sheet is used for electrically coupling terminals to each other.

FIG. 8A and FIG. 8B are sectional views showing an example of a conventional anisotropic conductive sheet and a coupling method thereof. FIG. 8A and FIG. 8B show a case in which an electronic component such as a semiconductor chip is coupled to a circuit board. However, the same method is employed in the case in which a semiconductor chip is directly coupled to a liquid crystal panel.

As shown in FIG. 8A, anisotropic conductive sheet 33 is obtained by dispersing conductive particles 35 in resin binder 34 that is a thermosetting adhesive resin and forming into a sheet. By using anisotropic conductive sheet 33, connection terminals 32 on circuit board 31 and electrode terminals 37 on electronic component 36 are coupled to each other. As shown in FIG. 8A, on circuit board 31, the above-mentioned anisotropic conductive sheet 33 is attached. Next, electrode terminals 37 on electronic component (for example, semiconductor chip) 36 are positioned to connection terminals 32.

Next, as shown in FIG. 8B, electronic component 36 is pressed against circuit board 31. By this pressing, the distance between electrode terminal 37 on electronic component 36 and connection terminal 32 on circuit board 31 is reduced, and electrode terminal 37 and connection terminal 32 are electrically coupled to each other with conductive particles 35. On the other hand, in a region other than a region between connection terminal 32 and electrode terminal 37, since anisotropic conductive sheet 33 is not compressed, the insulating property in the horizontal direction is secured. In this state, resin binder 34 is hardened. Note here that FIG. 8B shows that resin binder 34 becomes thermally hardened resin 38 after thermosetting.

In such a coupling method, in an anisotropic conductive sheet, low resistance is required in the vertical direction that is a coupling direction, and a high resistance state is required to be held and the adhesive strength is required to be improved between neighbors. In order to dissolve such problems, many developments have been done.

For example, Japanese Patent Unexamined Publication No. 11-306861 describes an anisotropic conductive film for preventing short circuiting between neighbors, and a coupling method using the same. This describes the use of an anisotropic conductive film including a mixture of a radiation curable resin that is hardened by radiation such as ultraviolet ray and a thermosetting resin, and conductive particles dispersed in the mixture. Furthermore, by attaching this anisotropic conductive film on a circuit board and, irradiation with radiation is carried out by using a mask having a light shielding portion in a position corresponding to a connection terminal on the circuit board. Next, the positions of electronic components are adjusted and pressurized, and then heated so as to be adhesively bonded. At this time, a region that has been previously irradiated with radiation is hardened and the movement of conductive particles in the horizontal direction is prevented. Therefore, short circuit between neighbors can be prevented.

Furthermore, Japanese Patent Unexamined Publication No. 2004-238443 describes an anisotropic conductive sheet using a resin in which hardening proceeds without need to carry out heat treatment by previously irradiating with light such as an ultraviolet ray so as to excite a hardening reaction as a method for simplifying steps of coupling electronic components on a circuit board. The coupling method using this anisotropic conductive sheet firstly excites a hardening reaction by irradiating the anisotropic conductive sheet with light, and then adhesively bonds electronic components to a circuit board while this anisotropic conductive sheet has tackiness, followed by holding at ordinary temperature. Thus, the hardening reaction is completed, and the electronic components are coupled to the circuit board.

The first example mentions that high density mounting can be achieved by preventing short circuiting between neighbors. However, when electronic components having different pitches or shapes of electrode terminals are mounted, a mask respectively corresponding to each of them is necessary. Furthermore, it is difficult to change the shape of the anisotropic conductive film in the region hardened by radiation. Therefore, in order to couple the electrode terminal on the electronic component and the connection terminal on the circuit board to each other via conductive particles with small coupling resistance, large pressing power is necessary. Recently, according to trend toward small and thin size, mounting of a semiconductor device with the thickness of 100 μm or less, a sheet-shaped device, or the like, has been required. However, such pressing power is applied to these devices, the devices may be damaged.

Furthermore, in the above-mentioned second example, by exciting a hardening reaction by previously irradiating with light, hardening can be carried out at ordinary temperature without need to carry out heat treatment. However, in this method, it is difficult to mount electronic components in which the intervals between electrode terminals and connection terminals vary.

Furthermore, in both examples, an anisotropic conductive film or sheet is attached only to a region on a circuit board in which an electronic component is mounted, followed by mounting electronic components on the anisotropic conductive film or sheet individually. In this method, the production steps become complicated.

SUMMARY OF THE INVENTION

An electronic circuit device of the present invention includes: a circuit board having conductor wiring and a connection terminal on at least one surface thereof, an anisotropic conductive resin layer provided on the one surface of the circuit board; and a plurality of electronic components each provided with an electrode terminal in a position facing the connection terminal. The anisotropic conductive resin layer includes at least one kind of conductive particles selected from coiled conductive particles, fiber fluff conductive particles and conductive particles having a plurality of conductive protrusions on the surface thereof, and a resin binder;

electrically couples the electrode terminals of the plurality of electronic components and the connection terminals to each other with the conductive particles; mechanically fixes the electronic components and the circuit board to each other; and protects the conductor wiring.

With such a configuration, it is possible to realize an electronic circuit device easily only by forming the anisotropic conductive resin layer on the circuit board, adjusting the positions of the electronic components to be mounted and pressing thereof, and heating and hardening thereof. Alternatively, when a delayed hardening insulating resin is used, it is possible to realize an electronic circuit device by carrying out irradiation with light so as to provide the tackiness in advance, positioning the electronic components to be mounted to the connection terminals and pressing thereof, adhesively fixing with the anisotropic conductive resin layer, followed by heating and hardening at ordinary temperature or temperatures of 100° C. or less. Furthermore, in a region on which electronic components are not formed on the circuit board, the anisotropic conductive resin layer is also provided. In this region, since pressing is not applied by the electronic components and the like, insulating property is excellent. It can be used as a protective film for the conductor wiring, and the like. Therefore, it is not necessary to form a conventional necessary protective film such as a resist film.

In the anisotropic conductive resin layer used in this electronic circuit device, it is possible to reduce resistance in the vertical direction, that is, in the direction in which the connection terminal and the electrode terminal are coupled to each other. On the other hand, the horizontal direction, that is, the direction between electrodes of the electronic components, high resistance can be maintained. This is because at least one kind of conductive particles selected from coiled conductive particles, fiber fluff conductive particles and conductive particles provided with a plurality of conductive protrusions is used. That is to say, in the case of, for example, conductive particles having large protrusions on the surface thereof, when the anisotropic conductive resin layer is compressed, the protrusion of this conductive particle is brought into contact with the connection terminal and the electrode terminal from the stage in which the interval is wide. Furthermore, a part of it is embedded in the surfaces of the connection terminal and the electrode terminal. Thus, not only electric connection but also mechanical fixation can be achieved. Therefore, as compared with the case where a conventional anisotropic conductive sheet is used, even if the electronic components have electrode terminals with different thicknesses, shapes and pitches, and the like, they can be electrically and mechanically coupled excellently by using the same anisotropic conductive resin layer.

Furthermore, a method for manufacturing an electronic circuit device includes: forming an anisotropic conductive layer by providing an anisotropic conductive resin layer including an anisotropic conductive resin on a circuit board, the anisotropic conductive resin including at least one kind of conductive particles selected from coil-shaped conductive particles, fiber fluff conductive particles and conductive particles having a plurality of conductive protrusions on the surface thereof, and a resin binder; positioning an electrode terminal of an electronic component to a connection terminal on the circuit board; pressing the electronic component so as to press-fit it into the anisotropic conductive resin layer, compressing the anisotropic conductive resin layer between the electrode terminal and the connection terminal, and bringing the electrode terminal and the connection terminal into electrical contact with each other by using the conductive particles; and hardening the anisotropic conductive resin layer and adhesively bonding and fixing the electronic component and the circuit board to each other.

According to this method, it is possible to manufacture an electronic circuit device by coupling the electronic components, for example, a combination of a semiconductor element and a passive component, or semiconductor elements having different thicknesses, and the like, by the same mounting method using the same anisotropic conductive resin layer. Consequently, the manufacturing steps can be simplified.

According to the electronic circuit device of the present invention having the above-mentioned configuration and manufacturing method, electronic components such as passive components and semiconductor elements for manufacturing various kinds of electronic circuit can be mounted by simple steps. Therefore, the manufacturing steps of the electronic circuit device can be simplified and manufacturing facility can be simplified. Therefore, various electronic circuit devices can be produced at a low cost, and a flexible manufacturing process can be realized

Figure 1A:
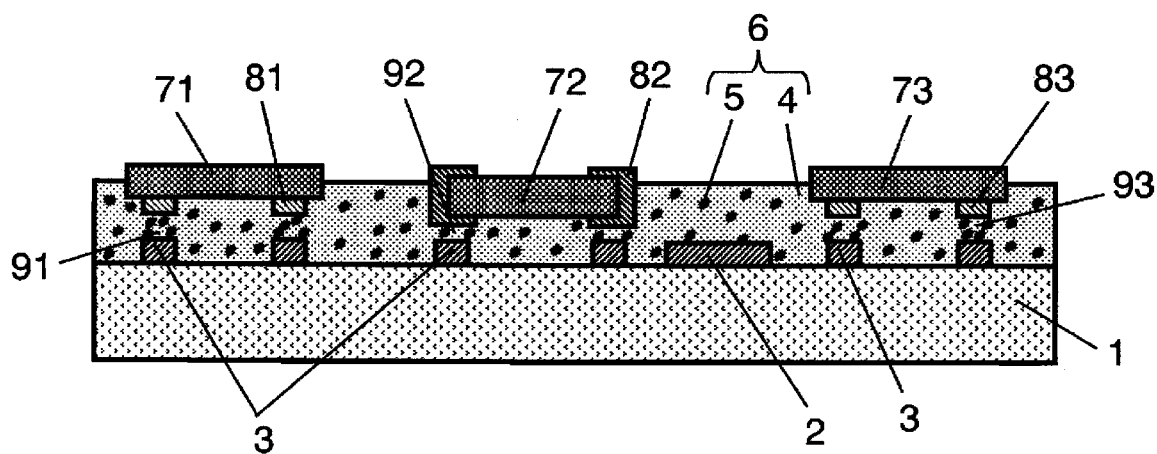
FIG. 1A is a sectional view showing an electronic circuit device in accordance with a first exemplary embodiment of the present invention.

REFERENCE MARKS IN THE DRAWINGS 1, 31, 101 circuit board
2 conductor wiring
3, 32 connection terminal
4, 34 resin binder
5, 35 conductive particle
6, 61 anisotropic conductive resin layer
10 ultraviolet ray
11, 23 photo-cured region
12, 17, 20, 24 hardened anisotropic conductive resin layer
13, 18 hardened fillet
14, 140 shielding plate
15, 150 light passing region
16 fillet
19 hardening reaction starting region
21 transfer substrate
22 adhesive layer
33 anisotropic conductive sheet
36 electronic component
51, 53 core
52, 54 protrusion
38 thermally hardened resin
71 first electronic component (electronic component)
72 second electronic component (electronic component)
73 third electronic component (electronic component)
81, 82, 83, 37 electrode terminal
91 first interval
92 second interval
93 third interval

DETAILED DESCRIPTION OF THE PREFERRED EMBODIMENT

Hereinafter, exemplary embodiments of the present invention are described in detail with reference to drawings. Note here that the same reference numerals are given to the same elements, and description therefor may be omitted.

First Exemplary Embodiment

Figure 1B:
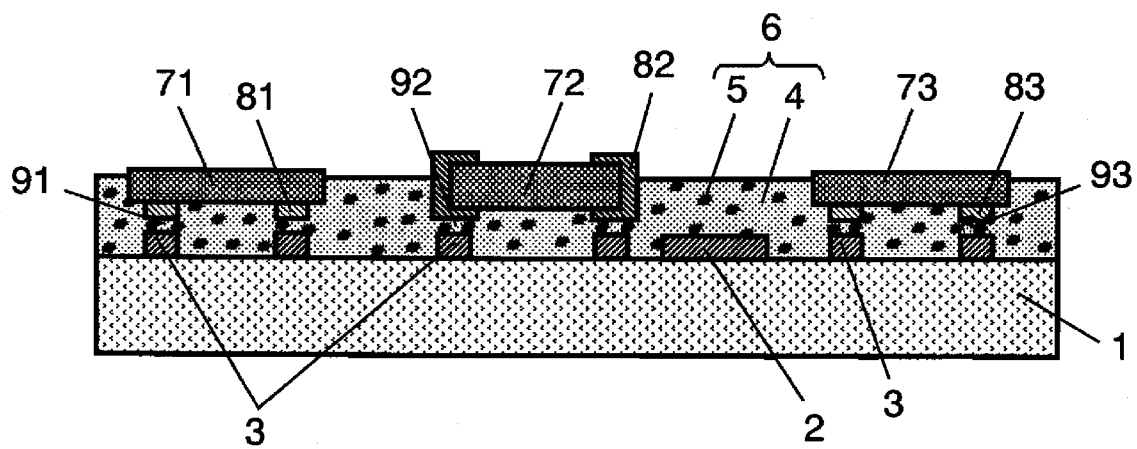
FIG. 1B is a sectional view showing an electronic circuit device in accordance with the first exemplary embodiment of the present invention.

FIGS. 1A and 1B are sectional views showing configurations of two kinds of electronic circuit devices in accordance with a first exemplary embodiment of the present invention. The difference in the configurations of the electronic circuit devices between FIG. 1A and FIG. 1B is as follows. That is to say, the thicknesses of electronic components, first electronic component 71, second electronic component 72 and third electronic component 73 are different from each other. In the configuration of FIG. 1A, these electronic components are disposed so that their rear surfaces are in the same plane. In FIG. 1B, the components are disposed so that intervals 91, 92, and 93 between connection terminal 3 and electrode terminals 81, 82, and 83 become the same.

As shown in FIG. 1A, the electronic circuit device in accordance with this exemplary embodiment includes circuit board 1 having conductor wiring 2 and connection terminal 3 on one surface thereof; anisotropic conductive resin layer 6 disposed on the one surface of circuit board 1; and first, second and third electronic components 71, 72 and 73 respectively having electrode terminals 81, 82 and 83 formed on positions facing connection terminal 3.

In this exemplary embodiment, anisotropic conductive resin layer 6 includes conductive particle 5 provided with a plurality of conductive protrusions on the surface thereof and resin binder 4. First, second and third electronic components 71, 72 and 73 are coupled to connection terminals 3 on circuit board 1 to which electrode terminals 81, 82 and 83 respectively correspond via anisotropic conductive resin layer 6. An interval between electrode terminal 81 and connection terminal 3 is defined as interval 91, an interval between electrode terminal 82 and connection terminal 3 is defined as interval 92, and an interval between electrode terminal 83 and connection terminal 3 is defined as interval 93.

The thicknesses of first electronic component 71 and third electronic component 73 are smaller than that of second electronic component 72. When these are coupled by the step of pressing them by using a flat plate, the rear surfaces of first, second and third electronic components 71, 72 and 73 are in the same plane. Therefore, first interval 91 and third interval 93 are larger than second interval 92. For example, when first electronic component 71 and third electronic component 73 are semiconductor elements having a thickness of 0.4 mm or less, and second electronic component 72 is 1005 type chip component, first interval 91 and third interval 93 are larger than second interval 92 by about 0.1 mm.

However, in this exemplary embodiment, since conductive particle 5 has a plurality of conductive protrusions on the surface thereof, with these protrusions, excellent coupling can be carried out even if there is the above-mentioned difference in the intervals. FIG. 1A shows a state in which first, second and third electronic components 71, 72 and 73 are disposed so that the rear surfaces thereof are in substantially the same plane and they are partially embedded in anisotropic conductive resin layer 6. Furthermore, anisotropic conductive resin layer 6 is also formed on the surface of conductor wiring 2 formed on circuit board 1, and it functions as a protective film.

FIG. 1B is a sectional view showing a configuration in which first, second and third electronic components 71, 72 and 73 are individually pressed, and then heated so as to harden anisotropic conductive resin layer 6 at once. In this case, first, second and third intervals 91, 92, and 93 can be substantially the same. In this case, second electronic component 72 protrudes as compared with first and third electronic components 71 and 73.

Which structure of the electronic circuit device shown in FIG. 1A and the electronic circuit device shown in FIG. 1B is employed may be appropriately determined by considering applications and entire configuration. However, when the structure shown in FIG. 1B is employed, it is preferable to use a delayed hardening insulating resin as resin binder 4. When such resin binder 4 is used, resin binder 4 in a region to be coupled is irradiated with light in advance so that the tackiness can be expressed. Thus, electronic components can be pressed against and adhesively bonded to connection terminals. Since resin binder 4 is hardened in the adhesively bonded state, it is possible to eliminate the need for heat treatment and the like.

Figure 2A:
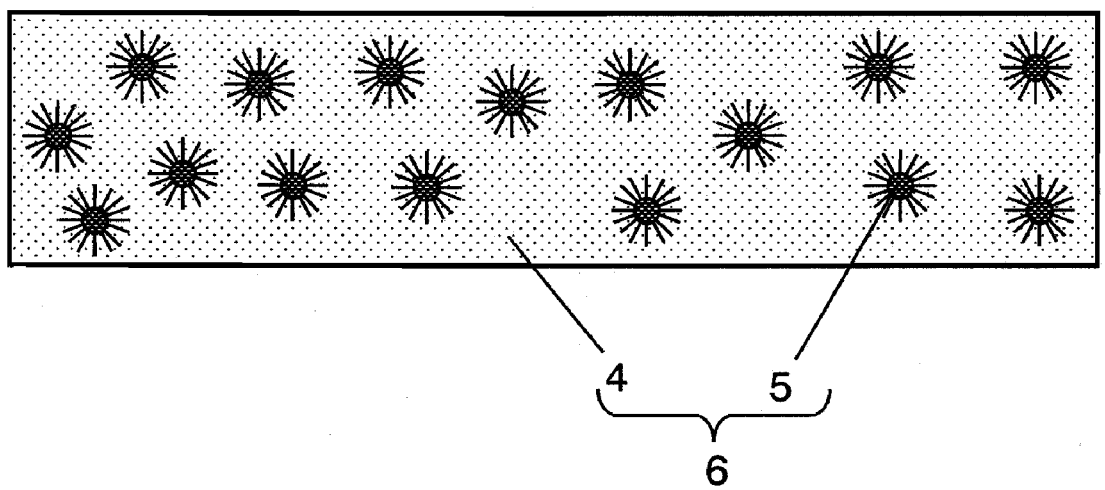
FIG. 2A is a schematic sectional view to illustrate an example of an anisotropic conductive resin layer used in this exemplary embodiment.
Figure 2B:
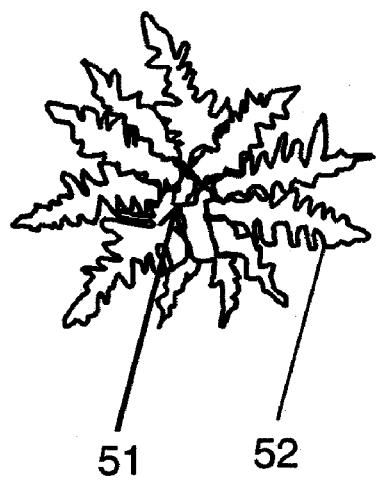
FIG. 2B is a sketch to illustrate an example of a shape of a conductive particle used in the anisotropic conductive resin.
Figure 2C:
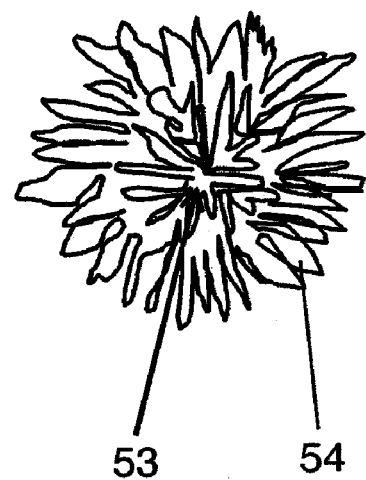
FIG. 2C is a sketch to illustrate an example of a shape of a conductive particle used in the anisotropic conductive resin.

Next, an example of the anisotropic conductive resin used for the electronic circuit device and the manufacturing method thereof in this exemplary embodiment are described with reference to FIGS. 2A to 2C. FIG. 2A is a sectional schematic view to illustrate an example of the anisotropic conductive resin layer used in this exemplary embodiment. FIGS. 2B and 2C are sketches to illustrate an example of the shape of the conductive particle used in the anisotropic conductive resin, respectively.

As shown in FIG. 2A, anisotropic conductive resin layer 6 has a configuration in which dendritic conductive particles 5 are dispersed in resin binder 4. As shown in FIGS. 2B and 2C, conductive particle 5 has a configuration in which a plurality of protrusions having conductivity and flexibility are formed on the surface thereof. FIG. 2B shows that dendritic protrusions 52 are formed on the surface of core 51. FIG. 2C shows that needle-shaped protrusions 54 are formed on the surface of core 53. The shape looks like, for example, sea-dwelling creature, sea urchin. However, this is just an example, and the shape is not particularly limited to this alone. Any shapes may be employed as long as dendritic protrusion 52 is formed on the surface of core 51. These conductive particles 5 have a large number of protrusions 52 and 54, and protrusions 52 and 54 largely protrude as compared with core 51 and 53, respectively. When such conductive particles 5 are used, as mentioned above, even if first, second and third intervals 91, 92 and 93 are different from each other, protrusions 52 and 54 can be brought into contact with electrode terminals 81, 82 and 83, reliably. Consequently, electric conductivity with small coupling resistance and high stability can be obtained. When the interval is small, protrusions 52 and 54 are deformed and a part of them digs into electrode terminals 81, 82 and 83 and connection terminal 3. When a part of protrusions 52 and 54 digs into in this way, not only electrical coupling but also mechanical coupling can be achieved. As a result, more stable coupling can be achieved.

As resin binder 4, any one of a photocurable insulating resin, a thermosetting insulating resin, a delayed hardening insulating resin and an anaerobic hardening insulating resin, or combination thereof may be used. An example of the desirable combination is thought to be resin binder 4 consisting of a photocurable insulating resin and a thermosetting insulating resin. An example of the former resin includes photocurable epoxy resin and acrylic resin. An example of the latter resin includes thermosetting epoxy resin and acrylic resin.

Furthermore, instead of the photocurable insulating resin, a delayed hardening insulating resin may be used. Alternatively, a delayed hardening insulating resin may be used singly. A delayed hardening insulating resin is also referred to as photo delayed hardening type, which starts a hardening reaction by irradiation with light and is completely hardened after the passage of a predetermined time. This delayed hardening insulating resin is partially hardened by irradiation with light (in particular, ultraviolet ray) and as a whole, it becomes a gel showing tackiness (or sticky or adhesive property). For a predetermined time, for example, for about several seconds to several tens minutes, the gel state can be maintained. Then, while the gel state is maintained, the hardening reaction gradually proceeds inside the adhesive agent, and the hardening is completed after the passage of a predetermined time.

As such a photocurable resin, it is preferable to use a resin having at least one cationic polymerization group in one molecule. An example of the resin having at least one cationic polymerization group in one molecule can include a vinyl ether resin, an epoxy resin, and the like. It is further preferable to use an epoxy resin having an excellent adhesive property, weather resistance, chemical resistance and heat resistance after the resin is hardened.

An example of the epoxy resin can include, although not particularly limited, bisphenol A epoxy resin, hydrogenated bisphenol A epoxy resin, bisphenol F epoxy resin, novolac epoxy resin, aliphatic cyclic epoxy resin, brominated epoxy resin, rubber modified epoxy resin, urethane modified epoxy resin, glycidyl ester based compound, epoxidized soybean oil, epoxidized elastomer, and the like. Furthermore, these resins can be used singly or in combination of two kinds or more.

A photoinitiator is not particularly limited as long as it is activated by irradiation with light and capable of inducing cationic polymerization. Preferably, a compound having a low thermal catalytic activity at temperatures in the range from 20° C. to 100° C. is preferred. It is advantageous because such a material is excellent in storage stability. An example of such a photo cationic polymerization initiator includes an iron-allene complex compound, aromatic diazonium salt, aromatic iodonium salt, aromatic sulfonium salt, pyridinium salt, and the like. Specific examples can include commercially available compositions or products, for example, OPTOMER SP-150 (manufactured by Asahi Denka Industry Co., Ltd.), UVE-1014 (manufactured by General Electric Company), and the like.

An example of dendritic crystal conductive particle 5 includes one including silver particles or nickel particles as a core and growing a dendritic crystal on the surface of the core, and one forming protrusions on the core by a plating method. Furthermore, as cores 5a and 5c, one obtained by forming a protrusion on the surface of polymer or ceramic particle may be used.

In addition, as conductive particle 5, other than the shapes shown in FIGS. 2B and 2C, a coiled conductive particle made of a fine coil, a fiber fluff conductive particle on at least the surface of which conductive fibers are entangled with each other, a conductive particle obtained by forming a conductor film on the surface of resin having protrusions, conductive particles having highly conductive polymer, or the like, can be used.

The average particle diameter of conductive particle 5 is not particularly limited but the range from 1 to 20 μm is preferred. When the diameter is less than 1 μm, aggregation power between conductive particles 5 is increased, which may make it difficult for the particles to disperse in resin binder 4 uniformly. On the other hand, when the diameter is more than 20 μm, in the case where the connection terminals are disposed with small pitches of about several tens μm, a possibility that short circuit is generated is increased. However, when the pitch of the connection terminals is large, particles with diameter of 20 μm or more may be used. When conductive particles 5 are blended in resin binder 4, the blending ratio of conductive particles 5: resin binder 4 is desirably 5 to 50:100.

Second Exemplary Embodiment

Figure 3A:
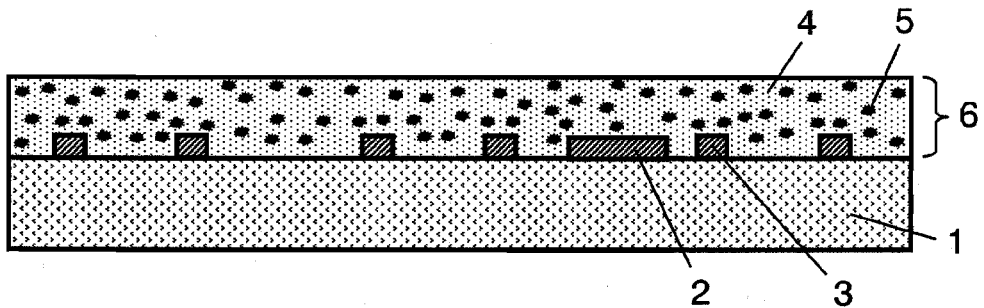
FIG. 3A is a sectional view to illustrate a method for manufacturing an electronic circuit device in accordance with a second exemplary embodiment of the present invention.
Figure 3B:
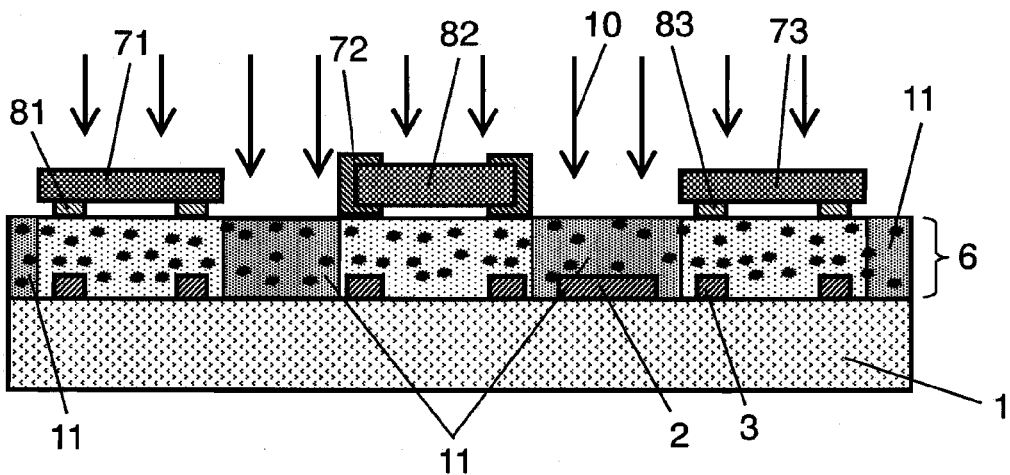
FIG. 3B is a sectional view to illustrate a method for manufacturing an electronic circuit device in accordance with the second exemplary embodiment of the present invention.
Figure 3C:
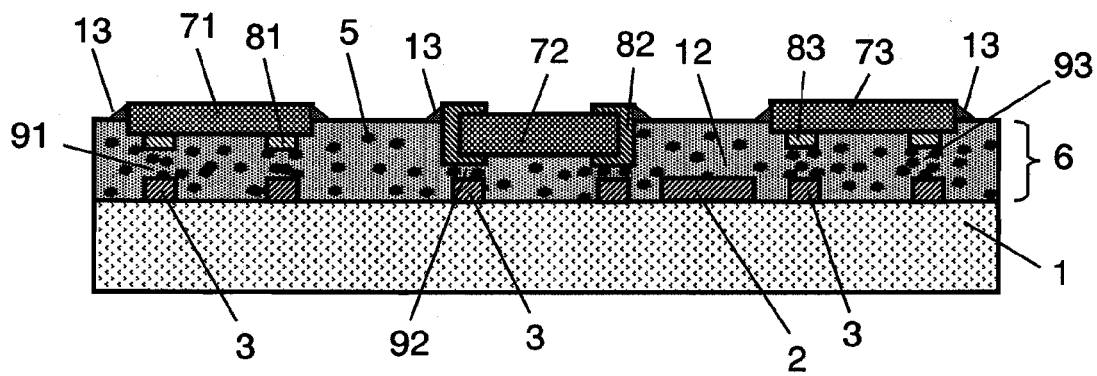
FIG. 3C is a sectional view to illustrate a method for manufacturing an electronic circuit device in accordance with the second exemplary embodiment of the present invention.

FIGS. 3A to 3C are sectional views to illustrate a method for manufacturing an electronic circuit device in accordance with a second exemplary embodiment of the present invention.

Firstly, as shown in FIG. 3A, on the main surface of circuit board 1 including conductor wiring 2 and connection terminal 3 thereon, anisotropic conductive resin layer 6 is formed. The steps shown in FIGS. 3A to 3C illustrate an example using anisotropic conductive resin layer 6 in which conductive particles 5 having the shape shown in FIG. 2C are dispersed in resin binder 4 including a photocurable insulating resin and a thermosetting insulating resin and having a surface tackiness. Anisotropic conductive resin layer 6 may be formed by attaching a sheet-shaped anisotropic conductive resin or by printing a paste-state anisotropic conductive resin.

Next, as shown in FIG. 3B, electrode terminals 81 on first electronic component 71 are positioned to connection terminals 3 on circuit board 1, and provisionally attached to anisotropic conductive resin layer 6. Similarly, second and third electronic components 72 and 73 are provisionally attached to anisotropic conductive resin layer 6. In this state, irradiation with ultraviolet ray 10 is carried out from the rear surface side of first second and third electronic components 71, 72 and 73 at once. In this case, since first, second and third electronic components 71, 72 and 73 are opaque, photocurable insulating resin located under these components are not hardened but photocurable insulating resin in the exposed region is photo-cured. This is shown by photo-cured region 11 in FIG. 3B. Since conductive particles 5 contained in photo-cured region 11 are fixed by hardened photocurable insulating resin, they are hardly moved in the later steps. On the other hand, anisotropic conductive resin layer 6 in a region shielded by first second and third electronic components 71, 72 and 73 are not hardened but maintain the initial state.

Next, first, second and third electronic components 71, 72 and 73 are pressed from the rear surfaces thereof. At this time, electronic components may be pressed individually or may be pressed all together. At this time, on the side surface of the electronic components, fillet is formed by an amount of electronic components digging into resin binder 4. When these portions are irradiated with light, first, second and third electronic components 71, 72 and 73 are strongly provisionally fixed, respectively.

When heating treatment is carried out in this state so that the thermosetting insulating resin in resin binder 4 is thermally hardened, an electronic circuit device shown in FIG. 3C is obtained. Since the thermosetting insulating resin in the fillet is also hardened, electronic components are coupled more strongly. In FIG. 3C, anisotropic conductive resin layer 6, after it is thermally hardened, is shown by thermally hardened anisotropic conductive resin layer 12; and a fillet, after it is thermally hardened, is shown by thermally hardened fillet 13.

In step shown in FIG. 3B, when first, second and third electronic components 71, 72 and 73 are pressed all together, the shape shown in FIG. 3C is obtained. That is to say, first interval 91 that is an interval between electrode terminal 81 of first electronic component 71 and connection terminal 3 is larger as compared with second interval 92 that is an interval between electrode terminal 82 of second electronic component 72 and connection terminal 3. This is because the thickness of first electronic component 71 is smaller than that of second electronic component 72. Furthermore, the relation between third electronic component 73 and second electronic component 72 is the same. However, in this exemplary embodiment, since conductive particle 5 having the shape shown in FIG. 2C is used, even if first interval 91 and third interval 93 are larger, excellent coupling between electrode terminals 81, 82 and 83 and respective connection terminals 3 can be achieved.

Third Exemplary Embodiment

FIGS. 4A to 4D are sectional views to illustrate a method for manufacturing an electronic circuit device in accordance with a third exemplary embodiment of the present invention.

Figure 4A:
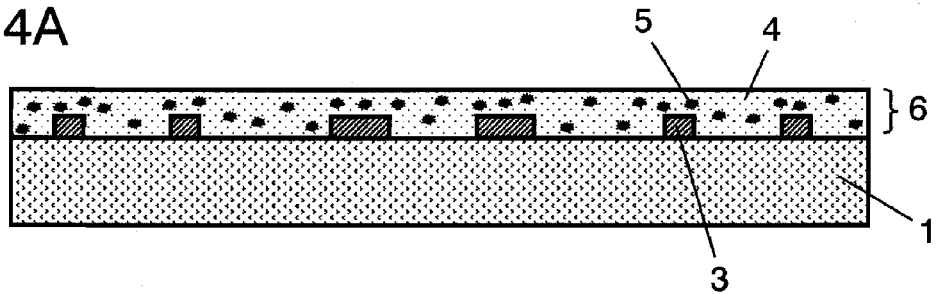
FIG. 4A is a sectional view to illustrate a method for manufacturing an electronic circuit device in accordance with a third exemplary embodiment of the present invention.

Firstly, as shown in FIG. 4A, on the main surface of circuit board 1 including conductor wiring (not shown) and connection terminal 3 thereon, anisotropic conductive resin layer 6 is formed. Anisotropic conductive resin layer 6 may be formed by attaching a sheet-shaped anisotropic conductive resin or by printing a paste-state anisotropic conductive resin. FIGS. 4A to 4D do not show conductor wiring formed on the surface of circuit board 1, however, similar to the circuit board shown in FIGS. 1A and 1B and FIGS. 3A to 3C, conductor wiring is formed.

The steps shown in FIGS. 4A to 4D illustrate an example using anisotropic conductive resin layer 6 in which conductive particles 5 shown in FIG. 2C are dispersed in resin binder 4 including a photocurable insulating resin and a thermosetting insulating resin and having surface tackiness.

Figure 4B:
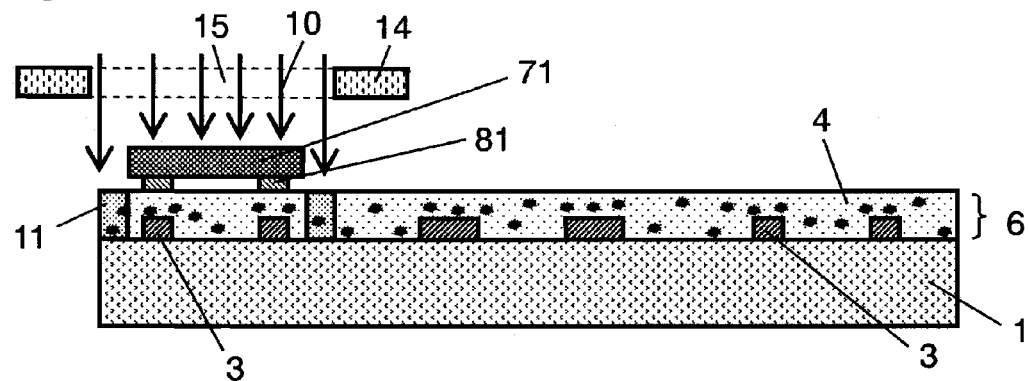
FIG. 4B is a sectional view to illustrate a method for manufacturing an electronic circuit device in accordance with the third exemplary embodiment of the present invention.

Next, as shown in FIG. 4B, electrode terminals 81 of first electronic component 71 are positioned to predetermined connection terminals 3 on circuit board 1. In this state, the peripheral portion of first electronic component 71 irradiated with ultraviolet ray 10, and in only the peripheral region, the photocurable insulating resin of anisotropic conductive resin layer 6 is photo-cured. Thus, photo-cured region 11 is formed. At this time, if necessary, by using shielding plate 14 having light passing region 15 only in a portion to be irradiated with light, irradiation with ultraviolet ray is carried out so that photocurable insulating resin in other coupling regions is not irradiated with light.

Figure 4C:
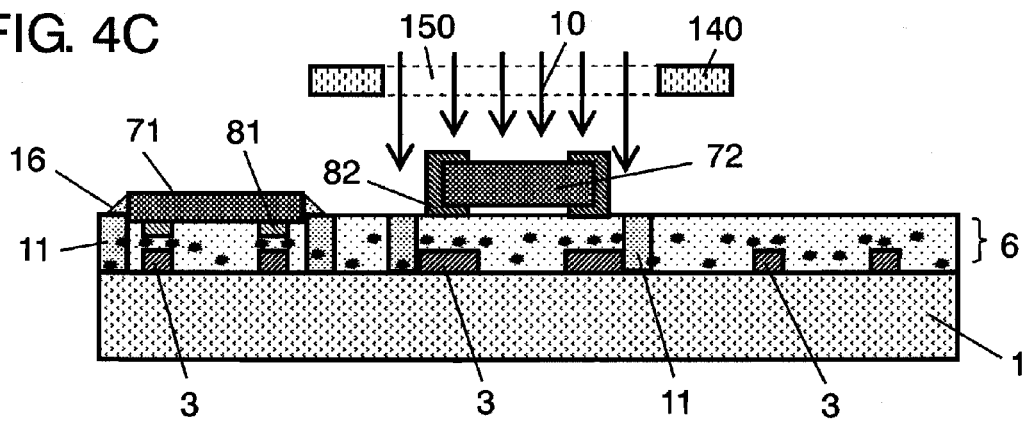
FIG. 4C is a sectional view to illustrate a method for manufacturing an electronic circuit device in accordance with the third exemplary embodiment of the present invention.

Next, as shown in FIG. 4C, first electronic component 71 is pressed and a part of it is embedded into anisotropic conductive resin layer 6, so that electrode terminal 81 and connection terminal 3 are coupled to each other with conductive particles 5. At this time, on the side surface of first electronic component 71, along the inner side of photo-cured region 11, resin of anisotropic conductive resin layer 6 is mounded and fillet 16 is formed.

Next, electrode terminals 82 of second electronic component 72 are positioned to predetermined connection terminals 3. In this state, the peripheral portion of second electronic component 72 is irradiated with ultraviolet ray 10, and in only the peripheral region, the photocurable insulating resin of anisotropic conductive resin layer 6 is photo-cured. Thus, photo-cured region 11 is formed. At this time, if necessary, by using shielding plate 140 having light passing region 150 only in a portion to be irradiated with light, irradiation with ultraviolet ray is carried out so that photocurable insulating resin in other coupling regions is not irradiated with light.

Figure 4D:
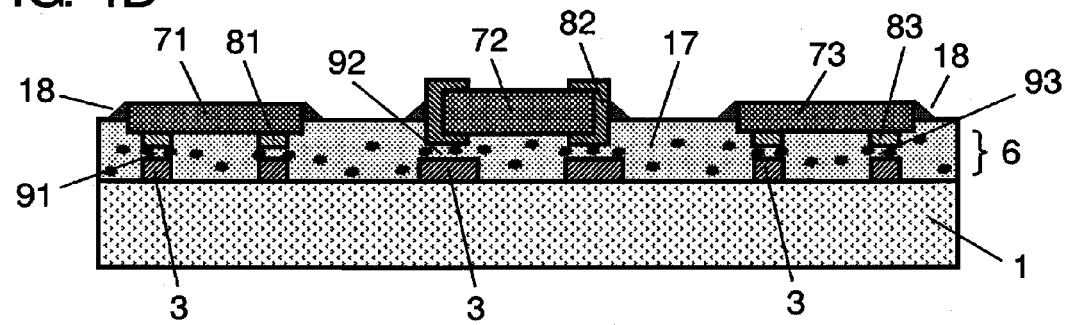
FIG. 4D is a sectional view to illustrate a method for manufacturing an electronic circuit device in accordance with the third exemplary embodiment of the present invention.

Next, as shown in FIG. 4D, second electronic component 72 is pressed and a part of it is embedded into anisotropic conductive resin layer 6, so that electrode terminal 82 and connection terminal 3 are coupled to each other with conductive particles 5. At this time, on the side surface of second electronic component 72, along the inner side of photo-cured region 11, resin of anisotropic conductive resin layer 6 is mounded and fillet 16 is formed. Similarly, third electronic component 73 is embedded into anisotropic conductive resin layer 6.

Thus, when first, second and third electronic components 71, 72 and 73 are embedded respectively and fillets 16 are formed, by irradiating fillets 16 with ultraviolet ray, electronic components can be provisionally fixed more strongly.

Thus, after all the necessary electronic components are attached, heating is carried out so as to thermally harden the thermosetting insulating resin. At this time, fillets 16 are also hardened, so that they become hardened fillets 18. Each electronic component is adhesively bonded strongly. In FIG. 4D, anisotropic conductive resin layer 6 is thermally hardened and shown as hardened anisotropic conductive resin layer 17.

In the manufacturing method of this exemplary embodiment, as shown in FIG. 4D, the embedded amount of first, second and third electronic components 71, 72 and 73 into anisotropic conductive resin layer 6 are made to be constant. Therefore, first, second and third intervals 91, 92 and 93 that are intervals between electrode terminals 81, 82 and 83 on these electronic components and respective connection terminals 3 on circuit board 1 are substantially equal to each other.

As described with reference to FIGS. 4A to 4D, in the manufacturing method of this exemplary embodiment, electrode terminals 81, 82 and 83 on electronic components are positioned to connection terminals 3 on circuit board 1, then photo-cured region 11 is formed in the peripheral portion of each electronic component so as to regulate the movement of conductive particles 5 by this region. Therefore, high resistance in the horizontal direction is secured as well as adhesive strength of the electronic component is improved with fillet 16.

In this exemplary embodiment, a planar ultraviolet ray irradiation source and shielding plates 14 and 140 having light passing regions 15 and 150 are used. However, irradiation may be carried out by using, for example, a spot light beam. Since such a spot light beam can be easily led into a necessary portion by an optical fiber, it is effective when irradiation with respect to small space or local irradiation is carried out. Therefore, it is possible to carry out selective irradiation with respect to a necessary portion.

Fourth Exemplary Embodiment

FIGS. 5A to 5D are sectional views to illustrate a method for manufacturing an electronic circuit device in accordance with a fourth exemplary embodiment of the present invention.

Figure 5A:
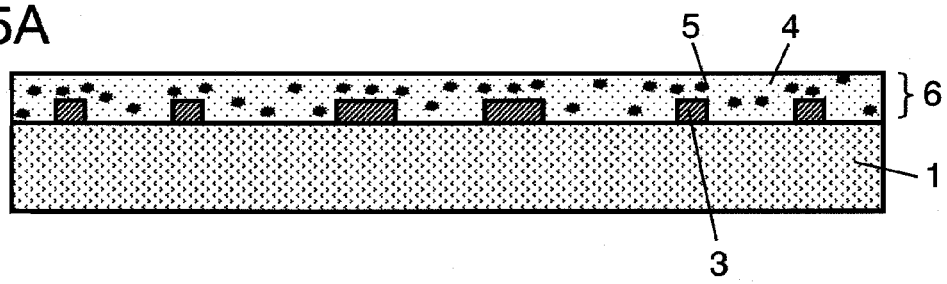
FIG. 5A is a sectional view to illustrate a method for manufacturing an electronic circuit device in accordance with a fourth exemplary embodiment of the present invention.

Firstly, as shown in FIG. 5A, on the main surface of circuit board 1 including conductor wiring (not shown) and connection terminal 3 thereon, anisotropic conductive resin layer 6 is formed. Anisotropic conductive resin layer 6 may be formed by attaching a sheet-shaped anisotropic conductive resin or by printing a paste-state anisotropic conductive resin. FIGS. 5A to 5D do not show conductor wiring formed on the surface of circuit board 1, however, similar to the circuit board shown in FIGS. 1A and 1B and FIGS. 3A to 3C, conductor wiring is formed.

The steps shown in FIGS. 5A to 5D illustrate an example using anisotropic conductive resin layer 6 in which conductive particles 5 shown in FIG. 2C are dispersed in resin binder 4 including a photocurable insulating resin and a thermosetting insulating resin and having a surface tackiness.

Figure 5B:
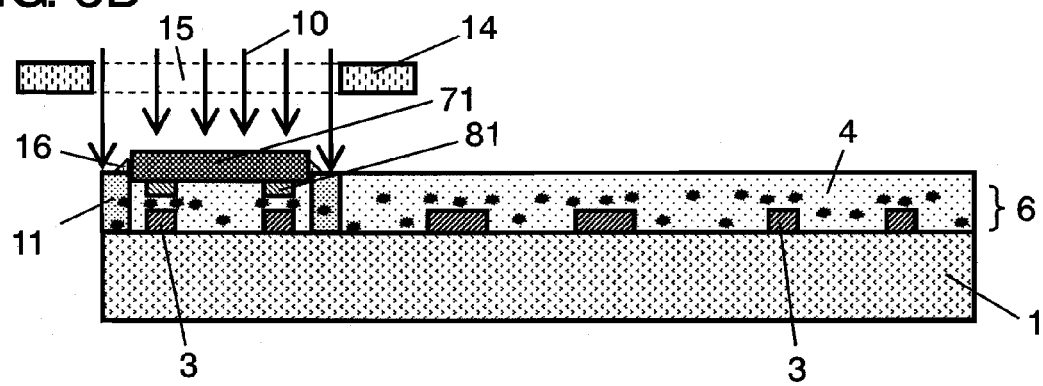
FIG. 5B is a sectional view to illustrate a method for manufacturing an electronic circuit device in accordance with the fourth exemplary embodiment of the present invention.

Next, as shown in FIG. 5B, electrode terminals 81 of first electronic component 71 are positioned to connection terminals 3 on circuit board 1. Next, first electronic component 71 is pressed and a part of it is embedded into anisotropic conductive resin layer 6, so that electrode terminal 81 and connection terminal 3 are coupled to each other with conductive particle 5.

In this pressed state, the peripheral portion of first electronic component 71 is irradiated with ultraviolet ray 10, and photocurable insulating resin in anisotropic conductive resin layer 6 is photo-cured. Thus, photo-cured region 11 is formed only in the peripheral portion of first electronic component 71. At this time, photocurable insulating resin in fillet 16 formed in a peripheral portion of first electronic component 71 is also photo-cured, and first electronic component 71 is provisionally fixed strongly. At this time, if necessary, by using shielding plate 14 having light passing region 15 only in a portion to be irradiated with light, irradiation with ultraviolet ray is carried out so that photocurable insulating resin in other coupling regions is not irradiated with light.

Figure 5C:
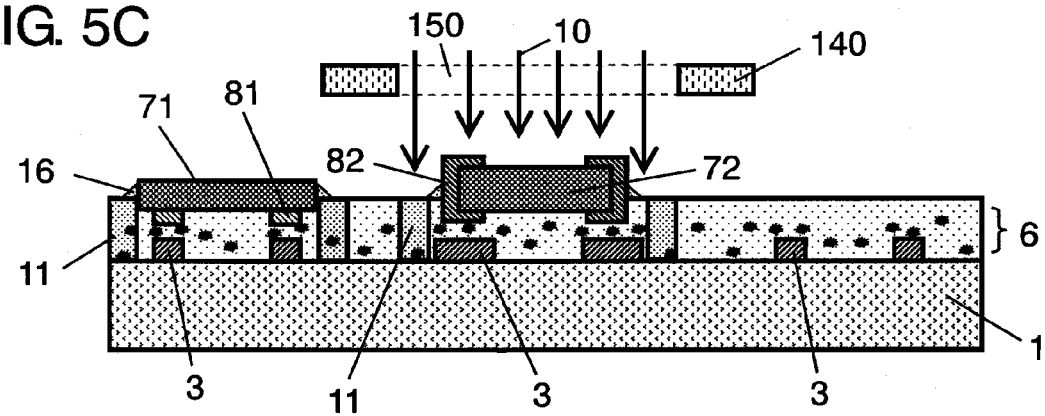
FIG. 5C is a sectional view to illustrate a method for manufacturing an electronic circuit device in accordance with the fourth exemplary embodiment of the present invention.

Next, as shown in FIG. 5C, electrode terminals 82 of second electronic component 72 is positioned to connection terminals 3 on circuit board 1. Then, second electronic component 72 is pressed and a part of it is embedded into anisotropic conductive resin layer 6. Thus, electrode terminal 82 and connection terminal 3 are coupled to each other with conductive particle 5.

In this pressed state, the peripheral portion of second electronic component 72 is irradiated with ultraviolet ray 10, and photocurable insulating resin in anisotropic conductive resin layer 6 is photo-cured. Thus, photo-cured region 11 is formed in the peripheral portion of second electronic component 72. Also at this time, if necessary, by using shielding plate 14 having light passing region 15 only in a portion to be irradiated with light, irradiation with ultraviolet ray is carried out so that photocurable insulating resin in other coupling regions is not irradiated with light.

Figure 5D:
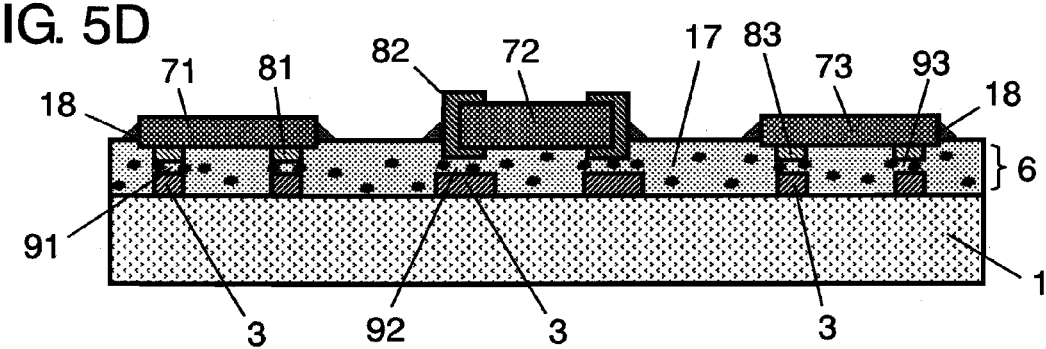
FIG. 5D is a sectional view to illustrate a method for manufacturing an electronic circuit device in accordance with the fourth exemplary embodiment of the present invention.

Next, as shown in FIG. 5D, similar to the above-mentioned method, third electronic component 73 is also partially embedded in anisotropic conductive resin layer 6 and coupled thereto.

Thus, after all the necessary electronic components are attached, heating is carried out so as to thermally harden the thermosetting insulating resin. At this time, fillets 16 are also hardened, so that they become hardened fillets 18. Consequently, first, second and third electronic components 71, 72 and 73 are strongly adhesively bonded. Since anisotropic conductive resin layer 6 is thermally hardened, it is shown as hardened anisotropic conductive resin layer 17.

The difference between the manufacturing method of the electronic circuit device according to this exemplary embodiment and those according to the second and third exemplary embodiments is in that the electrode terminal of each electronic component is positioned to connection terminal on the circuit board, each electronic component is pressed, and the electrode terminal is coupled to the connection terminal, followed by carrying out irradiation with light. That is to say, by carrying out irradiation with light in a state in which each electronic component is pressed, a photo-cured region formed in the peripheral portion of the electronic components and the fillets coupled thereto are photo-cured. Consequently, until the thermally hardening is carried out, since each electronic component is fixed to a circuit board reliably, the later handling is facilitated.

In this exemplary embodiment, a planar ultraviolet ray irradiation source and shielding plates 14 and 140 having light passing regions 15 and 150 are used. However, irradiation may be carried out by using, for example, a spot light beam. Since such a spot light beam can be easily led into a necessary portion by an optical fiber, it is effective when irradiation with respect to small space or local irradiation is carried out. Therefore, it is possible to carry out selective irradiation with respect to a necessary portion.

Fifth Exemplary Embodiment

FIGS. 6A to 6D are sectional views to illustrate a method for manufacturing an electronic circuit device in accordance with a fifth exemplary embodiment of the present invention.

Figure 6A:
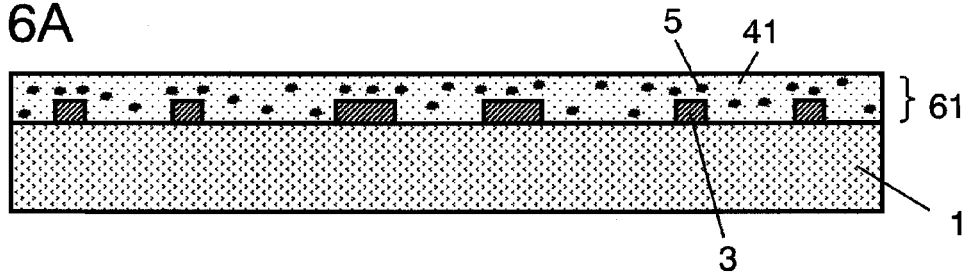
FIG. 6A is a sectional view to illustrate a method for manufacturing an electronic circuit device in accordance with a fifth exemplary embodiment of the present invention.

Firstly, as shown in FIG. 6A, on the main surface of circuit board 1 including conductor wiring (not shown) and connection terminal 3 thereon, anisotropic conductive resin layer 61 is formed. Anisotropic conductive resin layer 61 may be formed by attaching a sheet-shaped anisotropic conductive resin or by printing a paste-state anisotropic conductive resin. FIGS. 6A to 6D do not show conductor wiring formed on the surface of circuit board 1, however, similar to the circuit board shown in FIGS. 1A and 1B and FIGS. 3A to 3C, conductor wiring is formed. Furthermore, the steps shown in FIGS. 6A to 6D illustrate an example using anisotropic conductive resin layer 61 in which conductive particles 5 shown in FIG. 2C are dispersed in resin binder 41 including a photocurable insulating resin and a thermosetting insulating resin.

Thus, the basic configuration of anisotropic conductive resin layer 61 of this exemplary embodiment is the same as that described in the manufacturing method from the second to fourth exemplary embodiments except that a delayed hardening type resin is used as a photocurable insulating resin. In the delayed hardening type photocurable insulating resin, when it is irradiated with light, the tackiness is expressed, at the same time, a hardening reaction is started and the hardening reaction proceeds when it is left at room temperature.

Figure 6B:
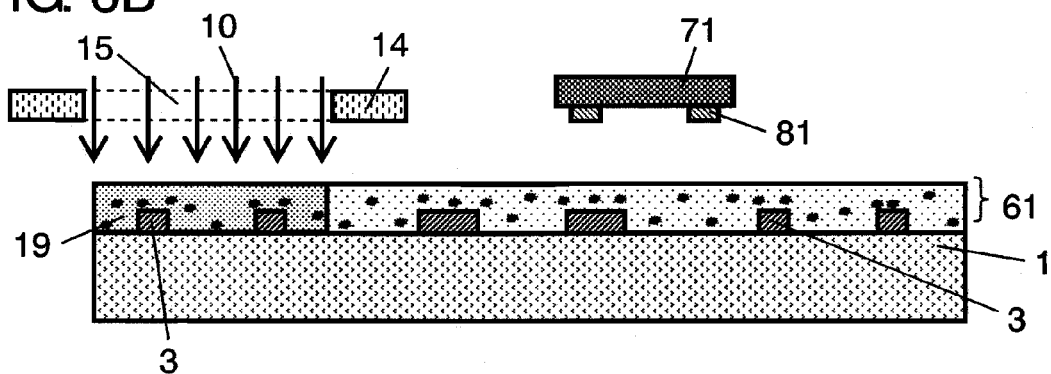
FIG. 6B is a sectional view to illustrate a method for manufacturing an electronic circuit device in accordance with the fifth exemplary embodiment of the present invention.

Next, as shown in FIG. 6B, only a region to which first electronic component 71 is to be coupled is irradiated with ultraviolet ray 10 so as to express the tackiness in the delayed hardening type resin and to start a hardening reaction. The region irradiated with light becomes hardening reaction starting region 19. At this time, if necessary, by using shielding plate 14 having light passing region 15 only in a portion to be irradiated with light, irradiation with ultraviolet ray is carried out so that photocurable insulating resin in other coupling regions is not irradiated with light.

Figure 6C:
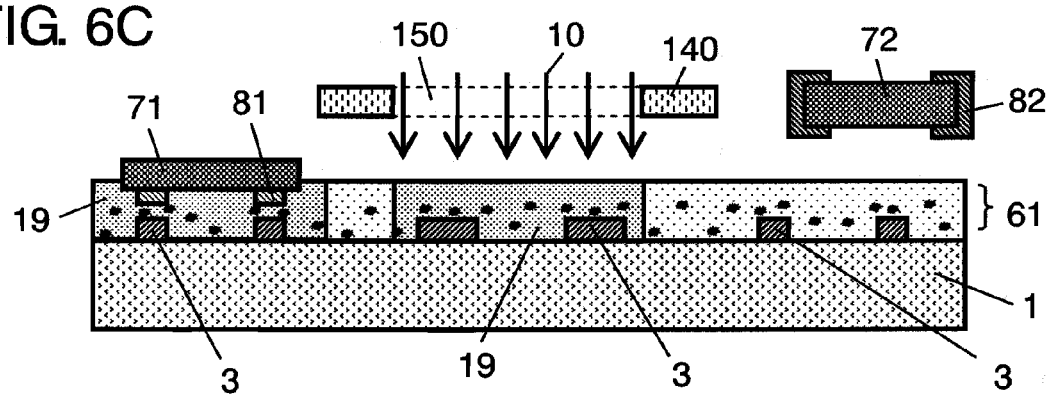
FIG. 6C is a sectional view to illustrate a method for manufacturing an electronic circuit device in accordance with the fifth exemplary embodiment of the present invention.

Next, as shown in FIG. 6C, electrode terminals 81 of first electronic component 71 are positioned to connection terminals 3 on circuit board 1, and first electronic component 71 is pressed, so that electrode terminals 81 and connection terminals 3 are coupled and fixed to each other. Thereafter, since the hardening reaction proceeds and hardening is carried out, first electronic component 71 is coupled and fixed.

Next, only a region to which second electronic component 72 is to be coupled is irradiated with ultraviolet ray 10 so as to start a hardening reaction. If necessary, similar to the above, shielding plate 140 is used.

Figure 6D:
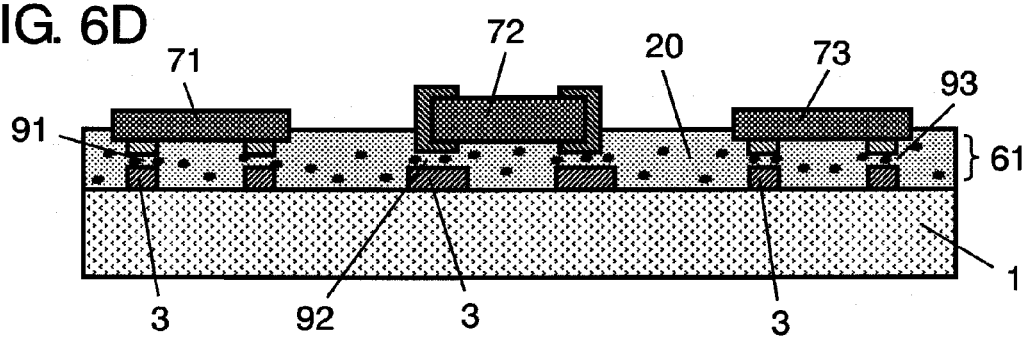
FIG. 6D is a sectional view to illustrate a method for manufacturing an electronic circuit device in accordance with the fifth exemplary embodiment of the present invention.

Next, as shown in FIG. 6D, electrode terminals 82 of second electronic component 72 are positioned to connection terminals 3 on circuit board 1, and second electronic component 72 is pressed, so that electrode terminals 82 and connection terminals 3 are coupled and fixed to each other. Thereafter, since the hardening reaction proceeds and hardening is carried out, second electronic component 72 is coupled and fixed.

Thus, after all the necessary electronic components are attached, heating is carried out so as to thermally harden the thermosetting insulating resin. Since anisotropic conductive resin layer 61 is thermally hardened, it is shown as hardened anisotropic conductive resin layer 20.

The manufacturing method of the electronic circuit device in this exemplary embodiment is different from those from second to fourth exemplary embodiments in that a delayed hardening type resin is used as a photocurable insulating resin of anisotropic conductive resin layer 61. That is to say, by adjusting the time from irradiation with light to pressing of each electronic component and the hardening time, optimal step condition can be set easily. Furthermore, by carrying out irradiation with light individually for each electronic component, the tackiness is expressed. Therefore, each electronic component can be held in a state in which it is coupled and fixed. As such a delayed type insulating resin, it is possible to employ one formed of the material described in accordance with the first exemplary embodiment.

The manufacturing method of this exemplary embodiment describes a method of repeating starting of hardening and press-fitting of electronic components for each individual electronic component. However, the present invention is not particularly limited to this alone. For example, it may be possible to employ a method of irradiating the entire surface with light and then sequentially press-fitting electronic components. Furthermore, the manufacturing method of this exemplary embodiment describes an example using resin binder 41 including a delayed type insulating resin and a thermosetting insulating resin. However, the present invention is not particularly limited to this alone. For example, only the delayed hardening insulating resin may be used. In this case, it may be hardened at room temperature or, if necessary, it may be heated at temperature of about 100° C. or less so as to prompt hardening.

Sixth Exemplary Embodiment

Figure 7A:
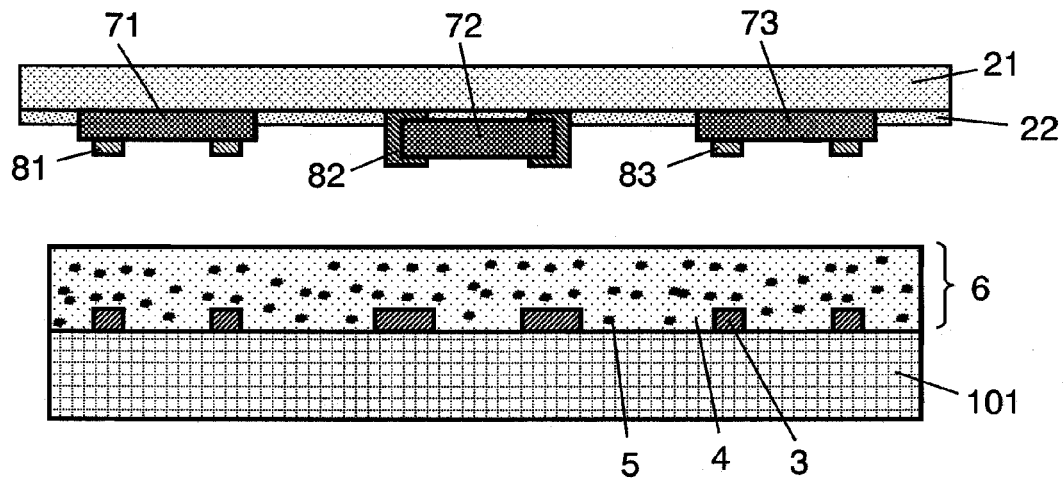
FIG. 7A is a sectional view to illustrate a method for manufacturing an electronic circuit device in accordance with a sixth exemplary embodiment of the present invention.
Figure 7B:
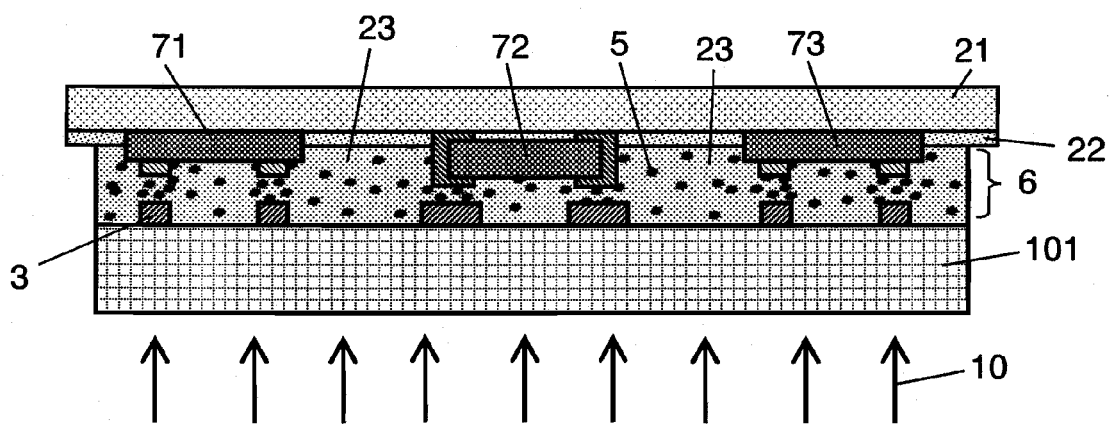
FIG. 7B is a sectional view to illustrate a method for manufacturing an electronic circuit device in accordance with the sixth exemplary embodiment of the present invention.
Figure 7C:
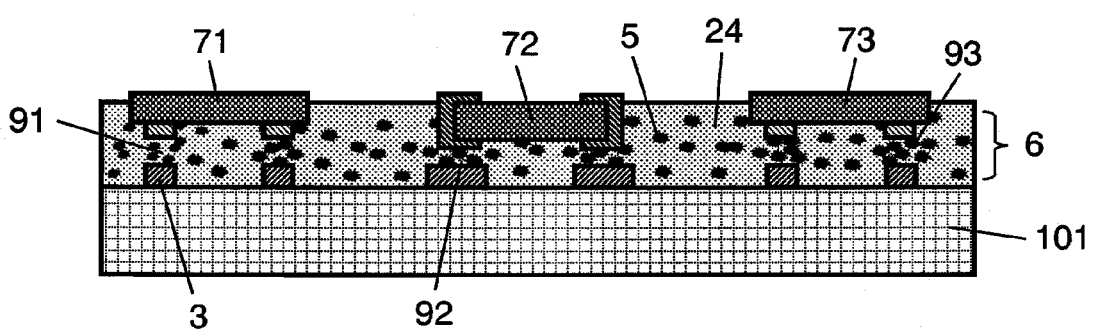
FIG. 7C is a sectional view to illustrate a method for manufacturing an electronic circuit device in accordance with the sixth exemplary embodiment of the present invention.
Figure 8A:
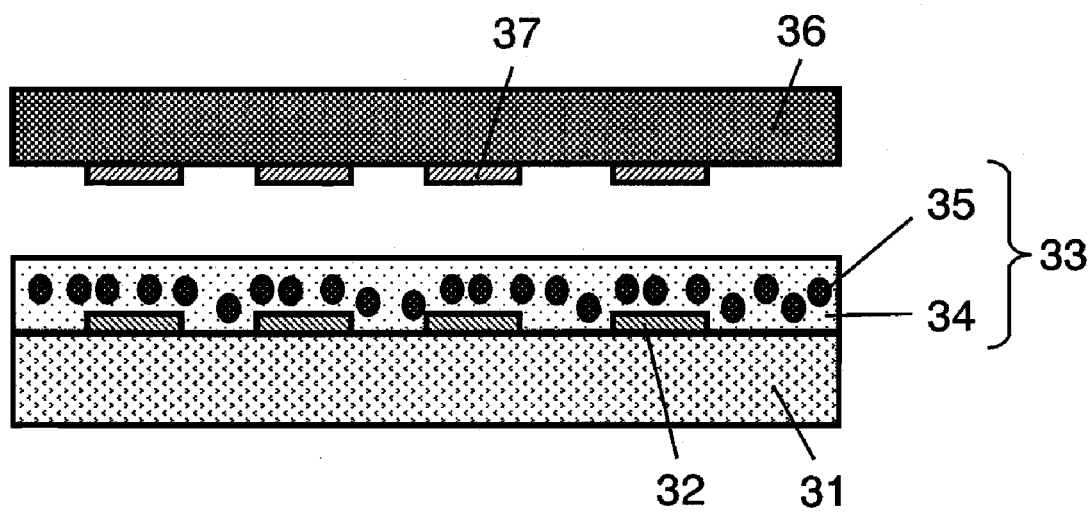
FIG. 8A is a sectional view showing an example of a conventional anisotropic conductive sheet and a coupling method thereof.
Figure 8B:
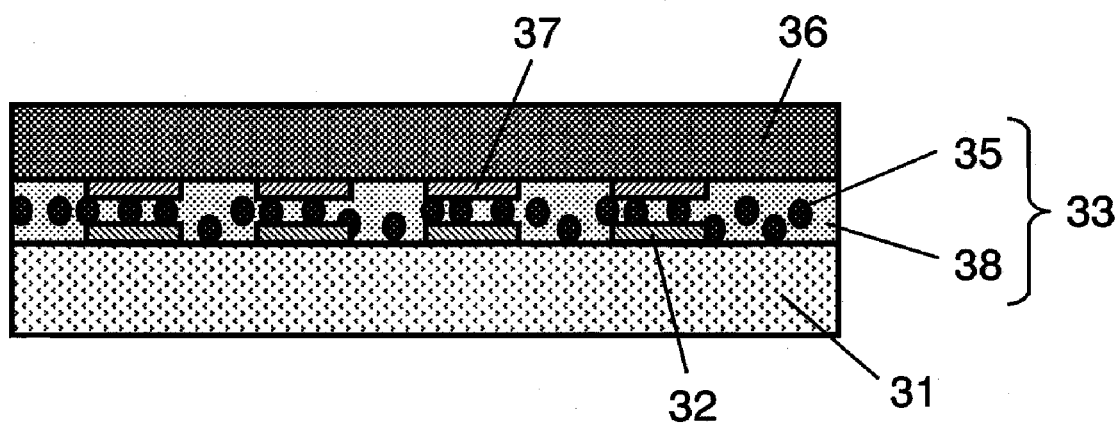
FIG. 8B is a sectional view showing an example of a conventional anisotropic conductive sheet and a coupling method thereof.

FIGS. 7A to 7C are sectional views to illustrate a method for manufacturing an electronic circuit device in accordance with a sixth exemplary embodiment of the present invention.

Firstly, as shown in FIG. 7A, on the main surface of optically transparent circuit board 101 including conductor wiring (not shown) and connection terminal 3 thereon, anisotropic conductive resin layer 6 is formed. Anisotropic conductive resin layer 6 may be formed by attaching a sheet-shaped anisotropic conductive resin or by printing paste-state anisotropic conductive resin. FIGS. 7A to 7C do not show conductor wiring formed on the surface of circuit board 101, however, similar to the circuit board shown in FIGS. 1A and 1B and FIGS. 3A to 3C, conductor wiring is formed.

The steps shown in FIGS. 7A to 7C illustrate an example using anisotropic conductive resin layer 6 in which conductive particles 5 having the shape shown in FIG. 2C are dispersed in resin binder 4 including a photocurable insulating resin and a thermosetting insulating resin and having a surface tackiness.

Furthermore, on transfer substrate 21, the rear surfaces of first, second and third electronic components 71, 72 and 73 are provisionally fixed with adhesive layer 22. At this time, the electronic components are provisionally fixed so that they are disposed on circuit board 101.

Next, as shown in FIG. 7B, first, second and third electronic components 71, 72 and 73 are pressed to circuit board 101 via transfer substrate 21. At this time, since the rear surfaces of the respective electronic components are provisionally fixed to transfer substrate 21, first interval 91 that is an interval between electrode terminal 81 of first electronic component 71 and connection terminal 3 is larger as compared with second interval 92 that is an interval between electrode terminal 82 of second electronic component 72 and connection terminal 3. However, since the above-mentioned conductive particle 5 is used, even if there is difference in the intervals, the coupling resistance can be made small, excellent mounting can be carried out. Note here that a part of the thickness direction of the electronic component is press-fitted into anisotropic conductive resin layer 6.

In this state, irradiation with ultraviolet ray 10 is carried out from the side of optically transparent circuit board 101. With this irradiation, except for an opaque portion such as conductor wiring and terminal 3 on circuit board 101, photocurable insulating resin in anisotropic conductive resin layer 6 is photo-cured. Therefore, respective electronic components are fixed to circuit board 101 and conductive particles 5 in the photo-cured region are also cured. Note here that the photo-cured region is defined as photo-cured region 23.

Next, as shown in FIG. 7C, transfer substrate 21 is removed and heated so as to thermally harden the thermosetting insulating resin. Since anisotropic conductive resin layer 6 is thermally hardened, it is shown as hardened anisotropic conductive resin layer 24. Note here that as described in FIG. 7B, intervals between electrode terminals 81, 82 and 83 of the electronic components and respective connection terminals 3 on circuit board 101 are different by reflecting the difference in the thicknesses of the respective electronic components.

Thus, by using transfer substrate 21, displacement of the positions of the electronic components does not occur, and mounting can be carried out by pressing at once. Therefore, the steps of manufacturing the electronic circuit device can be further simplified.

Furthermore, FIG. 7A to 7C illustrate a method in which irradiation with ultraviolet ray is carried out from the side of optically transparent circuit board 101 so as to harden each electronic component. However, the present invention is not particularly limited to this alone. For example, when the circuit board is opaque, an optically transparent transfer substrate is used and irradiation with ultraviolet ray may be carried out from the side of the transfer substrate. In this case, the same effect can be obtained. Furthermore, both the circuit board and transfer substrate are made to be optically transparent and irradiation with light may be carried out from both surfaces.

Furthermore, when adhesive layer 22 formed on the main surface of transfer substrate 21 is formed of a material losing an adhesive property by irradiation with light, after the step of irradiating anisotropic conductive resin layer 6 with light, transfer substrate 21 can be removed easily. Furthermore, adhesive layer 22 may be formed of a material losing an adhesive property when it is heated. That is to say, since the electronic components are securely held by transfer substrate 21 until thermal hardening is carried out, the electronic components are not displaced during the steps, and transfer substrate 21 can be easily removed after a final step.

Furthermore, in accordance with the first to sixth exemplary embodiments, as the resin binder, at least one selected from a photocurable insulating resin, a thermosetting insulating resin, a delayed hardening insulating resin that starts a hardening reaction by irradiation with light and completes the hardening after the passage of a predetermined time, and an anaerobic hardening insulating resin may be used. In this case, as the thermosetting insulating resin, a material that shrinks by hardening may be used. When such a hardening shrinking type resin is used, the coupling resistance can be further reduced and adhesive strength can be increased. Furthermore, as the resin binder used for the anisotropic conductive resin, when the combination of an ultraviolet hardening type adhesive resin and a thermosetting resin is used, stress can be relaxed, thus improving the reliability of the coupling portion.

Furthermore, the manufacturing method in accordance with the second to sixth exemplary embodiments may be a method in which, after the step of forming the anisotropic conductive layer, the step of positioning is carried out with respect to a plurality of electronic components, and then the step of pressing of components and the step of hardening are carried out with respect to the plurality of electronic components at once. With this method, the plurality of electronic components are positioned to predetermined positions, and then, they can be pressed and hardened to be coupled at once. Consequently, the manufacturing steps can be simplified. In particular, since the combination of a passive component and a semiconductor element or a plurality of electronic components including semiconductor elements having different thicknesses can be coupled at once, the steps can be remarkably simplified as compared with conventional steps.

Furthermore, a method may include, after the step of forming the anisotropic conductive layer, carrying out the step of positioning and the step of pressing of components with respect to a plurality of electronic components, and then, carrying out the hardening step with respect to a plurality of electronic components at once. With this method, even when a thermosetting resin is used as the resin material of the anisotropic conductive resin layer, steps until the step of pressing of components are carried out for each individual electronic component and the step of hardening can be carried out with respect to a plurality of electronic components at once. Therefore, heating of the electronic components can be minimized. Consequently, even an electronic component with relatively weak thermal resistance can be coupled together. Even when such an electronic component is used, steps can be simplified. As the method for hardening the anisotropic conductive resin layer, hardening by heating, hardening by irradiation with ultraviolet ray, or the combination thereof, and the like, can be selected depending upon resin materials to be used.

Furthermore, the resin binder of the anisotropic conductive resin includes a photocurable insulating resin and a thermosetting insulating resin. The method may further include, after the step of positioning, a step of irradiating only a peripheral portion of the electronic component with light from a side of the electronic component in a state in which the electronic component is fixed to the anisotropic conductive resin layer. Furthermore, the method may further include a second light irradiation step of irradiating the anisotropic conductive resin layer in the peripheral portion of the electronic component with light in a state in which the electronic component is pressed in the step of pressing of components in the above-mentioned method. With such a method, a plurality of electronic components can be mounted on the circuit board in a simple technique. In particular, even in the case of using electronic components having different thicknesses or having different number of electrodes or pitches, defect such as short circuit in the horizontal direction does not easily occur, and electronic circuit devices having high reliability can be manufactured.

Furthermore, the resin binder of the anisotropic conductive resin includes a photocurable insulating resin and a thermosetting insulating resin. The method may further include a step of irradiating the anisotropic conductive resin layer in the peripheral portion of the electronic component with light after the electrode terminal and the connection terminal are brought into electrical contact with each other by using the conductive particles in the step of pressing of components. With such a method, in a state in which the electrode terminals of the electronic component and the connection terminals on the circuit board are electrically coupled to each other with the conductive particles by pressing the electronic components, the peripheral portion of the electronic components and a fillet generated by pressing and embedding of the electronic components are irradiated with light so as to be provisionally hardened, thereby the coupling state can be made more stable. Consequently, it is possible to take a sufficient time from the time when the plurality of electronic components are mounted to the time when thermally hardening is carried out. Thus, the manufacturing steps can be adjusted easily.

The resin binder of the anisotropic conductive resin includes a delayed hardening insulating resin that starts a hardening reaction by irradiation with light and completes the hardening after the passage of a predetermined time and a thermosetting insulating resin. The method may further include, after the step of forming an anisotropic conductive layer, a step of starting hardening of the delayed hardening insulating resin by previously irradiating the anisotropic conductive resin layer in a coupling region on the circuit board to which electronic components are coupled with light. With such an electronic component, the hardening of the delayed hardening insulating resin proceeds in a state in which by pressing the electronic components, electrode terminals of the electronic components and connection terminals on the circuit board are electrically coupled to each other with conductive particles. Consequently, it is possible to lower the thermal hardening temperature or to shorten the heating time. Furthermore, by appropriately selecting materials of the delayed hardening insulating resin and the thermosetting insulating resin and the mixing ratio thereof, the hardening rate of the delayed hardening insulating resin can be adjusted easily according to the manufacturing conditions.

Furthermore, the resin binder of the anisotropic conductive resin includes a delayed hardening insulating resin that starts a hardening reaction by irradiation with light and completes the hardening after the passage of a predetermined time and a thermosetting insulating resin. After the step of forming the anisotropic conductive layer, the method may repeat the step of starting hardening of the delayed hardening insulating resin by previously irradiating the anisotropic conductive resin layer in a coupling region on the circuit board to which electronic components are coupled with light, and the step of pressing of components, so that the plurality of electronic components are fixed to predetermined positions on the circuit board, and then carrying out the step of hardening. With this method, after the step of pressing is carried out individually with respect to electronic components on the circuit board, heating and thermally hardening at once. Thus, even if a plurality of different electronic components are mounted, stable and low-resistant coupling portion can be obtained. As a result, the manufacturing steps of an electronic circuit device can be simplified.

Furthermore, the resin binder of the anisotropic conductive resin includes a photocurable insulating resin and a thermosetting insulating resin. The circuit board is optically transparent. The method further may include the step of irradiating the anisotropic conductive resin layer with light from the rear surface side of the circuit board through the circuit board after the electrode terminals and the connection terminals are brought into electrical contact with each other in the pressing of components. With this method, when the circuit board is an optically transparent substrate, since light irradiation can be carried out from the rear surface side so that provisionally hardening can be carried out, the manufacturing steps can be simplified.

Furthermore, in the step of pressing of components of the above-mentioned method, when the anisotropic conductive resin layer is compressed, the conductive particle is deformed and a part of it is embedded into the connection terminal and the electrode terminal, so that the connection terminal and the electrode terminal may be electrically coupled to each other. With this method, even if electronic components having variation in the intervals between the connection terminals and the electrode terminals are used, the coupling resistance can be reduced. Furthermore, even if electronic components having different thicknesses are pressed at once, similarly, the coupling resistance can be reduced. Therefore, various electronic components can be mounted on the circuit board by using the same anisotropic conductive resin layer by the same mounting method. Thus, manufacturing step can be simplified.

Furthermore, in the light irradiation step in the above-mentioned method, irradiation with a spot light beam is carried out. Since such a spot light beam can be easily led into a necessary portion by an optical fiber, it is particularly useful for carrying out irradiation of small space or local irradiation.

Furthermore, an anisotropic conductive resin has a sheet shape, and by attaching the sheet-shaped anisotropic conductive resin to the circuit board, the anisotropic conductive resin layer may be formed. Alternatively, when the anisotropic conductive resin has a paste state, the anisotropic conductive resin layer may be formed by applying the paste-state anisotropic conductive resin to the circuit board. With such a method, an anisotropic conductive resin layer can be formed uniformly in the wide surface on the circuit board.

Furthermore, the first to sixth exemplary embodiments describe an example in which three electronic components are used. The present invention is not limited to this alone. The number of electronic components may be appropriately selected depending upon the scale of the electronic circuit device. Furthermore, the electronic components can include a chip-structured and surface-mounted passive component such as a chip resistor, a chip capacitor, an inductor element, and the like, or sensor, furthermore, a semiconductor element having a bare chip configuration, a package type semiconductor element, and the like. Any electronic components generally used as an electronic circuit device can be used.

Furthermore, the first to sixth exemplary embodiments describe a case of using conductive particles including a core and needle-like protrusions formed on the surface of the core. However, conductive particles including a core and dendritic protrusions are formed on the surface of the core may be used. Furthermore, when coiled conductive particles or fiber fluff conductive particles are used, the same effect can be obtained.

Furthermore, the first to sixth exemplary embodiments describe a configuration in which a surface layer of the circuit board includes conductor wiring and connection terminal. The circuit board may be a multi-wiring including inner conductor or conductor wiring on the rear surface, furthermore, through conductor and the like. This circuit board may be a board using resin, ceramic, glass, film, and the like.

INDUSTRIAL APPLICABILITY

An electronic circuit device of the present invention has a configuration in which electronic components are mounted on a circuit board by using an anisotropic conductive resin including conductive particles having protrusions on the surface thereof dispersed in the resin binder. Such an electronic circuit device and manufacturing method thereof can manufacture various electronic circuit devices by a simple step and at a low cost. It is useful in various fields of electronic equipment.

The invention claimed is:

1. A method for manufacturing an electronic circuit device comprising:

forming an anisotropic conductive layer by providing an anisotropic conductive resin layer including an anisotropic conductive resin on a circuit board, the anisotropic conductive resin comprising a resin binder, and at least one kind of conductive particles selected from coil-shaped conductive particles, fiber fluff conductive particles and conductive particles having a plurality of conductive protrusions on the surface thereof;

positioning an electrode terminal of an electronic component to a connection terminal on the circuit board;

pressing the electronic component so as to press-fit it into the anisotropic conductive resin layer, compressing the anisotropic conductive resin layer between the electrode terminal and the connection terminal, and bringing the electrode terminal and the connection terminal into electrical contact with each other via the conductive particles; and hardening the anisotropic conductive resin layer so as to adhesively bond and fix the electronic component and the circuit board to each other, wherein the resin binder of the anisotropic conductive resin comprises a delayed hardening insulating resin that starts a hardening reaction by irradiation with light and completes hardening after a passage of a predetermined time and a thermosetting insulating resin; and after the forming of the anisotropic conductive layer, starting hardening the delayed hardening insulating resin by previously irradiating the anisotropic conductive resin layer in a coupling region on the circuit board to which the electronic component is coupled with light.

2. The method of claim 1, wherein after the forming of the anisotropic conductive layer, the positioning and the pressing of components are carried out with respect to a plurality of electronic components, and then the hardening is carried out with respect to the plurality of electronic components at once.

3. The method of claim 1, wherein the resin binder of the anisotropic conductive resin includes a photocurable insulating resin and a thermosetting insulating resin, and the method further comprises, after the positioning, irradiating only a peripheral portion of the electronic component with light from a side of the electronic component in a state in which the electronic component is fixed on the anisotropic conductive resin layer.

4. The method of claim 3, further comprising a second light irradiation for irradiating the anisotropic conductive resin layer in the peripheral portion of the electronic component in a state in which the electronic component is pressed in the pressing of components.

5. The method of claim 1, wherein the resin binder of the anisotropic conductive resin comprises a photocurable insulating resin and a thermosetting insulating resin, and the method further comprises irradiating the anisotropic conductive resin layer in the peripheral portion of the electronic component with light after the electrode terminal and the connection terminal are brought into electrical contact with each other via the conductive particles in the pressing of components.

6. The method of claim 1, wherein the resin binder of the anisotropic conductive resin comprises a photocurable insulating resin and a thermosetting insulating resin, the circuit board is optically transparent, and the method further comprises irradiating the anisotropic conductive resin layer with light from the rear surface side of the circuit board through the circuit board after the electrode terminals and the connection terminals are brought into electrical contact with each other in the pressing of components.

7. The method of claim 1, wherein in the pressing of components, by compressing the anisotropic conductive resin layer, the conductive particles are deformed, and a part of the conductive particles is embedded into the connection terminal and the electrode terminal, so that the connection terminal and the electrode terminal are electrically coupled to each other.

8. The method of claim 3, wherein in the irradiation with light, irradiation is carried out with a spot light beam.

9. The method of claim 1, wherein the anisotropic conductive resin has a sheet shape, and the sheet-shaped anisotropic conductive resin is attached to the circuit board so as to form the anisotropic conductive resin layer.

10. The method of claim 1, wherein the anisotropic conductive resin is paste, and the anisotropic conductive resin paste is applied to the circuit board so as to form the anisotropic conductive resin layer.

11. A method for manufacturing an electronic circuit device comprising:

forming an anisotropic conductive layer by providing an anisotropic conductive resin layer including an anisotropic conductive resin on a circuit board, the anisotropic conductive resin comprising a resin binder and at least one kind of conductive particles selected from coil-shaped conductive particles, fiber fluff conductive particles and conductive particles having a plurality of conductive protrusions on the surface thereof;

positioning an electrode terminal of an electronic component to a connection terminal on the circuit board;

pressing the electronic component so as to press-fit it into the anisotropic conductive resin layer, compressing the anisotropic conductive resin layer between the electrode terminal and the connection terminal, and bringing the electrode terminal and the connection terminal into electrical contact with each other via the conductive particles; and hardening the anisotropic conductive resin layer so as to adhesively bond and fix the electronic component and the circuit board to each other, wherein after the forming of the anisotropic conductive layer, the positioning is carried out with respect to a plurality of electronic components, and then the pressing of components and the hardening are carried out with respect to the plurality of the electronic components at once, wherein the resin binder of the anisotropic conductive resin comprises a delayed hardening insulating resin that starts a hardening reaction by irradiation with light and completes hardening after a passage of a predetermined time and a thermosetting insulating resin; and after the forming of the anisotropic conductive layer, the method repeats the starting hardening of the delayed hardening insulating resin by previously irradiating the anisotropic conductive resin layer in the coupling region on the circuit board to which the electronic components are coupled with light and the pressing of components; and carries out the hardening after the plurality of electronic components are fixed to predetermined positions on the circuit board.

* * * * *